United States Patent
Kim et al.

(10) Patent No.: US 9,531,346 B2
(45) Date of Patent: Dec. 27, 2016

(54) SIGNAL PROCESSING APPARATUS AND METHOD

(71) Applicant: Samsung Electronics Co., Ltd., Suwon-si (KR)

(72) Inventors: Jong Pal Kim, Seoul (KR); Tak Hyung Lee, Suwon-si (KR); Hyoung Ho Ko, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 72 days.

(21) Appl. No.: 14/539,252

(22) Filed: Nov. 12, 2014

(65) Prior Publication Data

US 2016/0006417 A1 Jan. 7, 2016

(30) Foreign Application Priority Data

Jul. 2, 2014 (KR) .................. 10-2014-0082537

(51) Int. Cl.
| | |
|---|---|
| H03B 1/00 | (2006.01) |
| H03K 3/00 | (2006.01) |
| H03K 3/01 | (2006.01) |
| G01L 9/00 | (2006.01) |
| G01R 17/10 | (2006.01) |

(52) U.S. Cl.
CPC ............... *H03K 3/01* (2013.01); *G01L 9/0054* (2013.01); *G01R 17/105* (2013.01)

(58) Field of Classification Search
CPC ....................................... H03K 3/01
USPC .................................. 327/108–112
See application file for complete search history.

(56) References Cited

U.S. PATENT DOCUMENTS

| | | | |
|---|---|---|---|
| 5,804,978 A | 9/1998 | Scheerer et al. | |
| 6,369,650 B1 | 4/2002 | Hayat-Dawoodi | |
| 6,820,492 B2 | 11/2004 | Tsuji | |
| 7,586,988 B2 * | 9/2009 | Koyanagi | H04L 5/023 370/210 |
| 7,886,583 B2 | 2/2011 | Masser et al. | |
| 8,454,505 B2 | 6/2013 | Yazicioglu et al. | |
| 8,928,430 B2 * | 1/2015 | Song | H03H 7/40 333/126 |
| 9,209,846 B2 * | 12/2015 | Nakata | H04B 1/10 |
| 2012/0296391 A1 * | 11/2012 | Trier | A61N 1/36071 607/46 |

FOREIGN PATENT DOCUMENTS

| | | |
|---|---|---|
| KR | 10-0403633 B1 | 10/2003 |
| KR | 10-2007-0084590 A | 8/2007 |
| KR | 10-2012-0004169 A | 1/2012 |
| WO | WO 2004/047259 A2 | 6/2004 |

* cited by examiner

*Primary Examiner* — Lincoln Donovan
*Assistant Examiner* — Metasebia Retebo
(74) *Attorney, Agent, or Firm* — NSIP Law

(57) ABSTRACT

A signal processing apparatus includes a first electrical signal generator configured to generate a first electrical signal, a second electrical signal generator configured to generate a second electrical signal based on a voltage signal output from a variable impedance unit, and a multiplexer configured to selectively supply the first electrical signal and the second electrical signal to the variable impedance unit.

17 Claims, 8 Drawing Sheets

SIGNAL PROCESSING APPARATUS AND METHOD

CROSS-REFERENCE TO RELATED APPLICATION

This application claims the benefit under 35 USC 119(a) of Korean Patent Application No. 10-2014-0082537, filed on Jul. 2, 2014, in the Korean Intellectual Property Office, the entire disclosure of which is incorporated herein by reference for all purposes.

BACKGROUND

1. Field

The following description relates to a signal processing apparatus and a signal processing method.

2. Description of Related Art

A pressure or a temperature may be measured based on a change in impedance, a resistance, or a capacitance due to a change in the pressure or the temperature. In general, a Wheatstone bridge circuit may be used to measure the impedance varying in response to a change in an external environment. The Wheatstone bridge circuit may be widely used to measure a minute electrical signal, and may have an impedance value varying in response to the change in the external environment. The Wheatstone bridge circuit may be used to output a small change in the external environment as an electrical signal in a pressure sensor, a temperature sensor, a clamp sensor, a power sensor, a gravity sensor, and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a signal processing apparatus including a first electrical signal generator configured to generate a first electrical signal, a second electrical signal generator configured to generate a second electrical signal based on a voltage signal output from a variable impedance unit, and a multiplexer configured to selectively supply the first electrical signal and the second electrical signal to the variable impedance unit.

The apparatus may further include an amplifier configured to amplify the voltage signal output from the variable impedance unit.

The apparatus may further include a modulator configured to modulate the voltage signal input to the amplifier into a signal of a high frequency band, and a demodulator configured to demodulate a frequency component of the amplified voltage signal.

The signal processing apparatus may be configured to selectively operate in a first operation mode in which the first electrical signal generator is activated to generate the first electrical signal, and selectively operate in a second operation mode in which the first electrical signal generator is inactivated to halt generation of the first electrical signal.

The second electrical signal generator may be configured to store the voltage signal output from the variable impedance unit in the first operation mode, and generate the second electrical signal based on the stored voltage signal in the second operation mode.

In the second operation mode, the second electrical signal generator may be configured to generate a common-mode voltage signal based on the stored voltage signal as the second electrical signal.

The multiplexer may be configured to supply the first electrical signal to the variable impedance unit in the first operation mode, and supply the second electrical signal to the variable impedance unit in the second operation mode.

The apparatus may further include an amplifier configured to amplify the voltage signal output from the variable impedance unit, and a sample and hold unit configured to sample the amplified voltage signal in the first operation mode, and hold the sampled voltage signal in the second operation mode.

The variable impedance unit may be configured to output the second electrical signal to the amplifier in the second operation mode.

The operating in the first operation mode and the operating in the second operation mode may alternate based on a control signal.

The variable impedance unit include an impedance element having an impedance value varying in response to a change in an external environment.

The variable impedance unit may be a Wheatstone bridge circuit.

The signal processing apparatus may be configured to operate in a wearable device.

In another general aspect, there is provided a signal processing method including supplying a first electrical signal to a variable impedance unit in a first operation mode, and supplying a second electrical signal to the variable impedance unit in a second operation mode, the second electrical signal being generated based on a voltage signal output from the variable impedance unit in the first operation mode.

The method may further include amplifying the voltage signal output from the variable impedance unit in the first operation mode, sampling the amplified voltage signal in the first operation mode, and holding the sampled voltage signal in the second operation mode.

The method may further include storing the voltage signal output from the variable impedance unit in the first operation mode, and generating the second electrical signal based on the stored voltage signal in the second operation mode.

The first electrical signal may be generated in only the first operation mode.

The first operation mode and the second operation mode may alternate based on a control signal.

In still another general aspect, there is provided a signal processing apparatus including a multiplexer configured to supply a first electrical signal to a variable impedance unit in a first operation mode, and an electrical signal generator configured to generate a second electrical signal based on a voltage signal output from the variable impedance unit in the first operation mode. The multiplexer is further configured to supply the second electrical signal to the variable impedance unit in a second operation mode.

The electrical signal generator may be configured to store the voltage signal output from the variable impedance unit in the first operation mode, and generate the second electrical signal based on the stored voltage signal in the second operation mode.

Other features and aspects will be apparent from the following detailed description, the drawings, and the claims.

Figure 1:
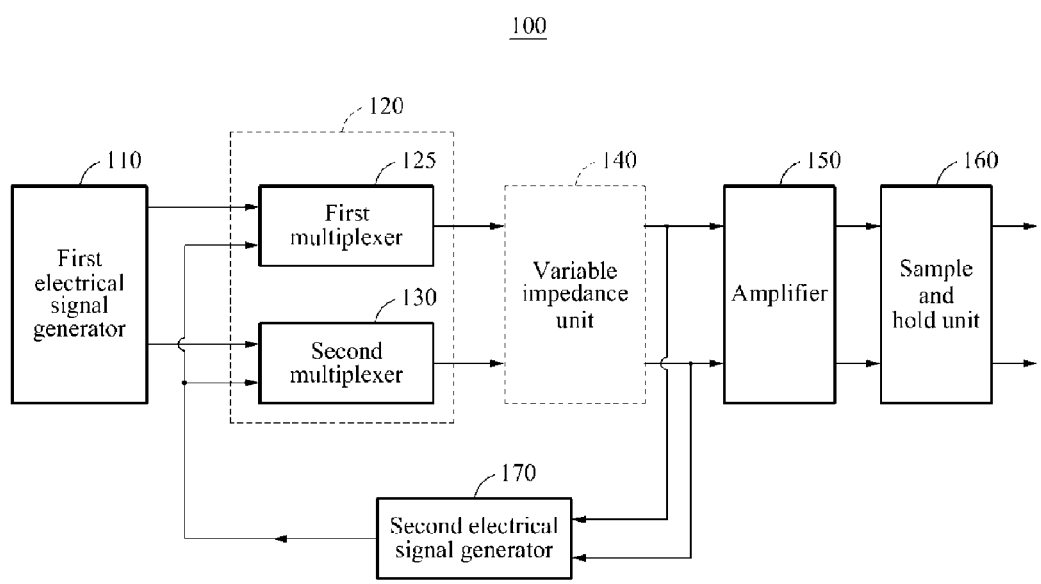
FIG. 1 is a diagram illustrating an example of a signal processing apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a diagram illustrating an example of a signal processing apparatus 100. The signal processing apparatus 100 supplies an electrical signal to a variable impedance unit 140, and amplifies a voltage signal output from the variable impedance unit 140. The signal processing apparatus 100 may operate in a circuit that measures a pressure or a temperature. In an example, the signal processing apparatus 100 may be applied to various wearable devices. For example, the signal processing apparatus 100 may operate in a wearable device provided in a form of, for example, a watch, a glove, clothing, a hat, a shoe, and/or other wearable devices known to one of ordinary skill in the art. The signal processing apparatus 100 may sense biometric information such as a blood pressure and a body temperature of a user, and transfer the sensed biometric information to the wearable device. The wearable device may process the biometric information received from the signal processing apparatus 100, and provide the processed biometric information to the user.

The variable impedance unit 140 may include an impedance element such as a resistor and a capacitor, and has an impedance value varying based on an external environment. For example, the variable impedance unit 140 may be a Wheatstone bridge circuit in which an impedance value varies in response to a change in a temperature or a pressure that is delivered from an external area. A high level of operation current signal may be used to operate the Wheatstone bridge circuit. A current in a range of tens of microamperes ($\mu A$) may be used in a general measurement circuit. In comparison, a current in a range of hundreds of $\mu A$ may be used to operate the Wheatstone bridge circuit. For example, when a resistor element included in the Wheatstone bridge circuit has a resistance value of three kiloohms, and when a voltage of 1.2 volts (V) is supplied to an input end of the Wheatstone bridge circuit, a constant operation current of 400 $\mu A$ may be used in the Wheatstone bridge circuit.

The signal processing apparatus 100 may reduce average power consumption in an entire circuit by reducing an amount of the operation current supplied to the variable impedance unit 140, for example, the Wheatstone bridge circuit. The signal processing apparatus 100 may reduce average power consumption in the Wheatstone bridge circuit by selectively activating and inactivating a power source supplying a power to the Wheatstone bridge circuit based on a control signal.

Referring to FIG. 1, the signal processing apparatus 100 includes a first electrical signal generator 110, a multiplexer 120, a second electrical signal generator 170, an amplifier 150, and a sample and hold unit 160. The multiplexer 120 includes a first multiplexer 125 and a second multiplexer 130. The signal processing apparatus 100 may operate in a first operation mode and a second operation mode. An operation performed by the signal processing apparatus 100 in each of the first operation mode and the second operation mode is determined based on a control signal. The first operation mode may be applied in a first time interval, and the second operation mode may be applied in a second time interval different from the first time interval. Temporally, the second operation mode may be initiated in response to a termination of the first operation mode, and the first operation mode may be performed in response to a termination of the second operation mode.

The signal processing apparatus 100 operates in the first operation mode as described below. In the first operation mode, the first electrical signal generator 110 is in an activated state to generate a first electrical signal to be supplied to the variable impedance unit 140. For example, the first electrical signal generated by the first electrical signal generator 110 may be an alternating voltage signal or an alternating current signal having a predetermined frequency component. The first electrical signal generator 110 transfers the generated first electrical signal to the multiplexer 120.

The multiplexer 120 determines an output signal to be output through the multiplexer 120, from among a plurality of input signals input based on the control signal. The multiplexer 120 supplies the first electrical signal generated by the first electrical signal generator 110 to the variable impedance unit 140. Each of the first multiplexer 125 and the second multiplexer 130 may supply the generated first electrical signal to the variable impedance unit 140. For example, electrical signals, each having a different level, may be applied to two input ends of the variable impedance unit 140.

The variable impedance unit 140 generates a voltage signal based on the transferred first electrical signal. In the variable impedance unit 140, the impedance value may vary in response to a change in the external environment, and the change in the impedance value may cause a change in the voltage signal to be output. The voltage signal output from the variable impedance unit 140 is input to the amplifier 150. The amplifier 150 amplifies the voltage signal output from the variable impedance unit 140. The voltage signal amplified by the amplifier 150 is transferred to the sample and hold unit 160. The sample and hold unit 160 samples the amplified voltage signal during an interval of the first operation mode. The sampled voltage signal may be stored in a capacitor element included in the sample and hold unit 160.

The second electrical signal generator 170 stores the voltage signal output from the variable impedance unit 140 and input to the amplifier 150, using, for example, the capacitor element. The second electrical signal generator 170 may store the voltage signal input to the amplifier 150 through a switching operation, and the stored voltage signal is used in the second operation mode.

The signal processing apparatus 100 operates in the second operation mode as described below. In the second operation mode, the first electrical signal generator 110 is in an inactivated state to halt generation of the first electrical signal. The second electrical signal generator 170 generates the second electrical signal based on the voltage signal stored in the first operation mode. For example, the second electrical signal may be a common-mode voltage signal of voltage signals input to the two input ends of the amplifier 150. The second electrical signal generator 170 may generate the common-mode voltage signal through a combination of the voltage signals input to the amplifier 150 and stored in the first operation mode. The common-mode voltage signal may be an average signal of the voltage signals input to the two input ends of the amplifier 150. For example, when voltage signals $V_a$ and $V_b$ are input to the two input ends of the amplifier 150, the second electrical signal generated by the second electrical signal generator 170 may be expressed as $(V_a+V_b)/2$.

The second electrical signal may be used to prevent an increase in a change of the voltage signal input to the amplifier 150 when the first electrical signal generator 110 is changed from the activated state to the inactivated state, or when the first electrical signal generator 110 is changed from the inactivated state to the activated state. Based on the second electrical signal, a swing width of the voltage signal input to the amplifier 150 during a time interval between the first operation mode and the second operation mode may decrease. The second electrical signal generator 170 transfers the generated second electrical signal to the multiplexer 120.

The multiplexer 120 supplies the second electrical signal generated by the second electrical signal generator 170 to the variable impedance unit 140. Each of the first multiplexer 125 and the second multiplexer 130 may supply the second electrical signal generated by the second electrical signal generator 170 to the variable impedance unit 140.

Since the second electrical signal having an identical level is supplied to each of the two input ends of the variable impedance unit 140, the variable impedance unit 140 may output the supplied second electrical signal directly through each of the two input ends, irrespective of the change in the external environment. The sample and hold unit 160 may hold or maintain the voltage signal output from the amplifier 150 and sampled in the first operation mode. The voltage signal output from the variable impedance unit 140 in the first operation mode may include meaningful information, and in the second operation mode, the signal processing apparatus 100 may output the voltage signal output from the amplifier 150 and sampled in the first operation mode.

Figure 2:
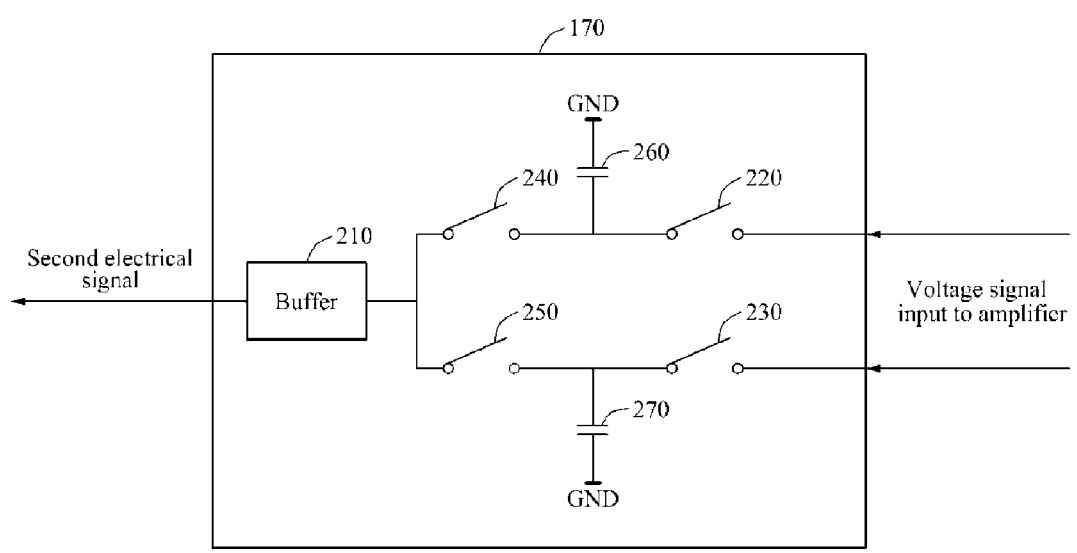
FIG. 2 is a diagram illustrating an example of a second electrical signal generator.

FIG. 2 is a diagram illustrating an example of the second electrical signal generator 170. Referring to FIGS. 1 and 2, the second electrical signal generator 170 may store a voltage signal input to the amplifier 150 or a voltage signal output from the variable impedance unit 140 in a first operation mode. In a second operation mode, the second electrical signal generator 170 generates a second electrical signal to be supplied to the variable impedance unit 140 based on the voltage signal stored in the first operation mode. In an example, the second electrical signal generator 170 includes a plurality of switches 220, 230, 240, and 250, a plurality of capacitor elements 260 and 270 connected to ground (GND), and a buffer 210. In the first operation mode, the switches 240 and 250 are opened, and the switches 220 and 230 are shorted. Thus, in the first operation mode, the voltage signal input to the second electrical signal generator 170 is stored in each of the capacitor elements 260 and 270.

When the first operation mode is terminated, and the second operation mode is initiated, the switches 220 and 230 are opened to block an input signal input to the second electrical signal generator 170. In the second operation mode, the switches 240 and 250 are shorted, and the voltage signal stored in each of the capacitor elements 260 and 270 are transferred to the buffer 210 through a combination. The voltage signal stored in each of the capacitor elements 260 and 270 may be mutually combined, thereby generating the second electrical signal in a form of a common-mode voltage signal. The buffer 210 transfers the second electrical signal to the multiplexer 120. The second electrical signal is supplied to the variable impedance unit 140 through the multiplexer 120.

Figure 3:
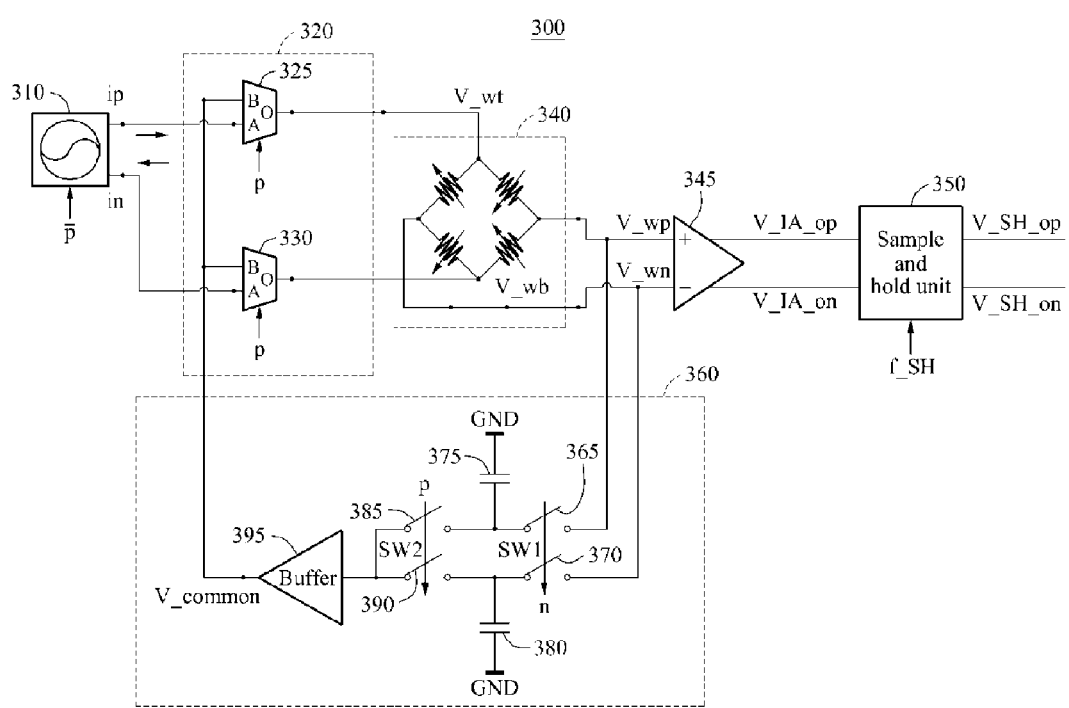
FIG. 3 is a diagram illustrating another example of a signal processing apparatus.

FIG. 3 is a diagram illustrating another example of a signal processing apparatus 300. Referring to FIG. 3, the signal processing apparatus 300 includes a first electrical signal generator 310, a multiplexer 320, a second electrical signal generator 360, an amplifier 345, and a sample and hold unit 350. The multiplexer 320 includes a first multiplexer 325 and a second multiplexer 330. The second electrical signal generator 360 includes a buffer 395, a plurality of switches 365, 370, 385, and 390, and a plurality of capacitor elements 375 and 380.

The signal processing apparatus 300 operates in a first operation mode during a first time interval, and operates in a second operation mode during a second time interval different from the first time interval. In the first operation mode and the second operation mode, an operation of each unit is controlled by a control signal. Hereinafter, the signal processing apparatus 300 operating in the first operation mode and the signal processing apparatus 300 operating in the second operation mode are explained separately with reference to the following descriptions.

In the first operation mode, the signal processing apparatus 300 operates as described below. The first electrical signal generator 310 is activated in the first operation mode. In an example, in an activated state, the first electrical signal generator 310 generates alternating current signals ip and in to be supplied to a variable impedance unit 340. The first electrical signal generator 310 is controlled by a control signal $\overline{P}$ that is inverted signal of a control signal p. That is, the control signal $\overline{P}$ may be a control signal having a reversed logic state to the control signal p. The control signal $\overline{P}$ may have a high logic state value in the first operation mode. The alternating current signals ip and in are transferred to the multiplexer unit 320. The alternating current signal ip and in are input to a terminal A of the first multiplexer 325 and a terminal A of the second multiplexer 330, respectively.

The multiplexer 320 determines an output signal to be output to an output terminal, from among a plurality of input signals based on the control signal p. Based on a logic state of the control signal p, each of the first multiplexer 325 and the second multiplexer 330 selectively determines a signal to be output through an output terminal O, between a signal input to the terminal A and a signal input to a terminal B. When the control signal p is in a high logic state, each of the first multiplexer 325 and the second multiplexer 330 may output the signal input to the terminal B, through the output terminal O. Conversely, when the control signal p is in a low logic state, each of the first multiplexer 325 and the second multiplexer 330 may output the signal input to the terminal A, through the output terminal O. In the first operation mode, the control signal p being in the low logic state may be transferred to each of the first multiplexer 325 and the second multiplexer 330, and the first multiplexer 325 and the second multiplexer 330 may output the input alternating current signals ip and in, through the output terminal O of the first multiplexer 325 and the output terminal O of the second multiplexer 330, respectively.

The output alternating current signals ip and in are transferred to two input terminals of the variable impedance unit 340 as voltage signals V_wt and V_wb, respectively. In this example, the variable impedance unit 340 is a Wheatstone bridge circuit. In the variable impedance unit 340, an impedance value may be changed in response to a change in an external environment, and the changed impedance value may be output as a change in a voltage signal. The variable impedance unit 340 outputs voltage signals V_wp and V_wn generated based on the alternating current signals ip and in, through two output terminals. The output voltage signals V_wp and V_wn are transferred to the amplifier 345. The amplifier 345 amplifies the voltage signals V_wp and V_wn, and outputs amplified voltage signals V_IA_op and V_IA_on. The sample and hold unit 350 samples the amplified voltage signals V_IA_op and V_IA_on based on a control signal f_SH as voltage signals V_SH_op and V_SH_on, respectively. The sample and hold unit 350 may store a result of the sampling in a storage element such as a capacitor element.

The voltage signals V_wp and V_wn are input to the second electrical signal generator 360. In the first operation mode, the switches 365 and 370 (SW1) are shorted, and the switches 385 and 390 (SW2) are opened. Operations of the switches 365 and 370 are controlled by a control signal n, and operations of the switches 385 and 390 are controlled by the control signal p. When a control signal being in the high logic state is transferred, the switches 365, 370, 385, and 390 may be shorted. When a control signal in the low logic state is transferred, the switches 365, 370, 385, and 390 may be opened. The switches 385 and 390 may be opened based on the control signal p in the low logic state, and the switches 365 and 370 may be shorted based on the control signal n in the high logic state. Based on above connection states of switches 365, 370, 385, and 390, the voltage signals V_wp and V_wn input to the second electrical signal generator 360 are stored in the capacitor elements 375 and 380, respectively. One end of each of the respective capacitor elements 375 and 380 is connected to ground (GND).

In the second operation mode, the signal processing apparatus 300 operates as described below. In the second operation mode, the control signal $\overline{P}$ in the low logic state may be input to the first electrical signal generator 310.

Based on the control signal $\overline{P}$, the first electrical signal generator 310 is inactivated to halt generation of a current signal. Thus, the second electrical signal generator 360 generates the second electrical signal, and transfers the generated second electrical signal to the multiplexer 320. The switches 365 and 370 may be opened when the control signal n in the low logic state is transferred. The switches 385 and 390 may be shorted when the control signal p in the high logic state is transferred.

The control signal n and the control signal p may not overlap. Logic states of the control signal n and the control signal p may be successively changed with a delay rather than at the same time. For example, when the first operation mode is changed to the second operation mode, the control signal n may be changed from the high logic state to the low logic state, and then, the control signal p may be changed from the low logic state to the high logic state. Thus, the switches 365 and 370 may be opened, and then, the switches 385 and 390 may be shorted. Conversely, when the second operation mode is changed to the first operation mode, the control signal p may be changed from the high logic state to the low logic state, and then, the control signal n may be changed from the low logic state to the high logic state. Thus, the switches 385 and 390 may be opened, and then, the switches 365 and 370 may be shorted such that voltage signals input to the amplifier 345 are stored in the capacitor elements 375 and 380.

When the switches 365 and 370 are opened, and the switches 385 and 390 are shorted, the stored voltage signals are transferred to the buffer 395 through a combination therebetween. A common-mode voltage signal V_common may be generated through the combination of the voltage signals stored in the capacitor elements 375 and 380. The buffer 395 may transfer the second electrical signal provided in a form of the common-mode voltage signal, to each of a terminal B of the first multiplexer 325 and a terminal B of the second multiplexer 330. The control signal p in the high logic state may be input to each of the first multiplexer 325 and the second multiplexer 330. Each of the first multiplexer 325 and the second multiplexer 330 transfers the input second electrical signal to each of the two input terminals of the variable impedance unit 340 through the output terminal O.

Since the second electrical signal having an identical level is input to each of the two input terminals of the variable impedance unit 340, the variable impedance unit 340 may output the second electrical signal directly through an output terminal. In the second operation mode, the sample and hold unit 350 may hold the amplified voltage signal V_IA_op and V_IA_on sampled in the first operation mode. In the second operation mode, the signal processing apparatus 300 may output the same signal as a signal finally output in the first operation mode. When the second operation mode is terminated, the signal processing apparatus 300 operates in the first operation mode. Since the first electrical signal generator 310 is inactivated in the second operation mode, power consumption in an entire circuit may be reduced. Also, by supplying the second electrical signal to the variable impedance unit 340 in the second operation mode, an increase in a swing width of a signal input to the amplifier may be prevented when an operation mode is changed.

Figure 4:
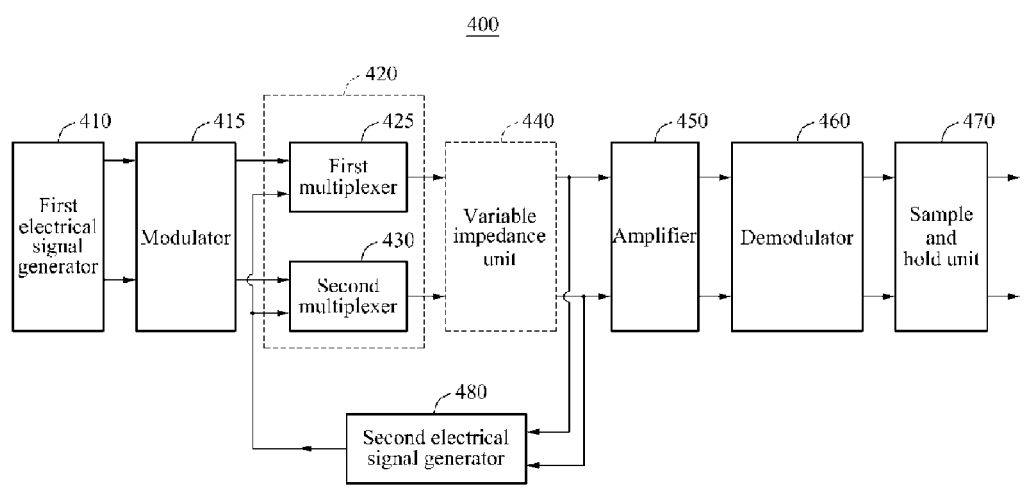
FIG. 4 is a diagram illustrating still another example of a signal processing apparatus.

FIG. 4 is a diagram illustrating still another example of a signal processing apparatus 400. Referring to FIG. 4, the signal processing apparatus 400 includes a first electrical signal generator 410, a modulator 415, a multiplexer 420, an amplifier 450, a demodulator 460, a sample and hold unit 470, and a second electrical signal generator 480. The multiplexer 420 includes a first multiplexer 425 and a second multiplexer 430. The signal processing apparatus 400 operates in a first operation mode and a second operation mode. Operations of the signal processing apparatus 400 in the first operation mode and the second operation mode are determined based on a control signal. Operations of the first electrical signal generator 410, the multiplexer 420, the amplifier 450, the sample and hold unit 470, and the second electrical signal generator 480 for each operation mode may be explained with reference to related descriptions of FIG. 1.

In FIG. 4, the signal processing apparatus 400 may reduce low frequency noise or flicker noise, and amplifies a signal, using the modulator 415 and the demodulator 460. For example, the modulator 415 and the demodulator 460 may be configured with a general chopper circuit. The modulator 415 modulates the first electrical signal output from the first electrical signal generator 410 into a signal of a high frequency band. The modulator 415 may modulate the first electrical signal into a signal of a frequency band not included in a low frequency noise band of the amplifier 450. The modulated first electrical signal is transferred to a variable impedance unit 440 through the multiplexer 420 in the first operation mode. A voltage signal output from the variable impedance unit 440 is transferred to the amplifier 450. The amplifier 450 amplifies the voltage signal, and outputs the amplified voltage signal. The demodulator 460 demodulates the amplified voltage signal output from the amplifier 450. The demodulator 460 may demodulate the amplified voltage signal into a signal of a frequency band on which the modulating is not performed by the modulator 415. The sample and hold unit 470 samples the signal output from the demodulator 460, and holds the sampled signal.

Figure 5A:
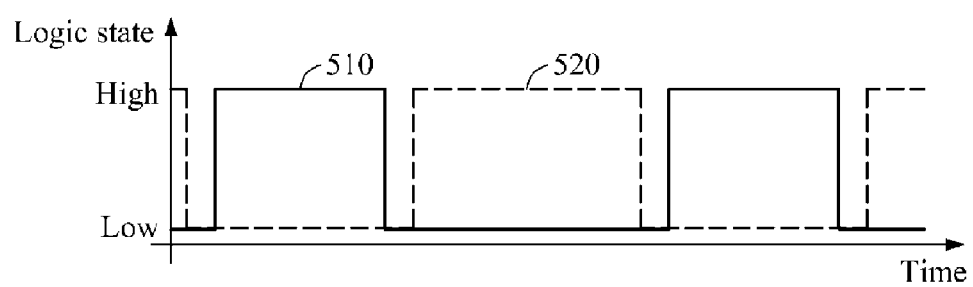
FIGS. 5A and 5B are diagrams illustrating examples of waveforms of a control signal used to control a signal processing apparatus and a first electrical signal generated by a first electrical signal generator, respectively.
Figure 5B:
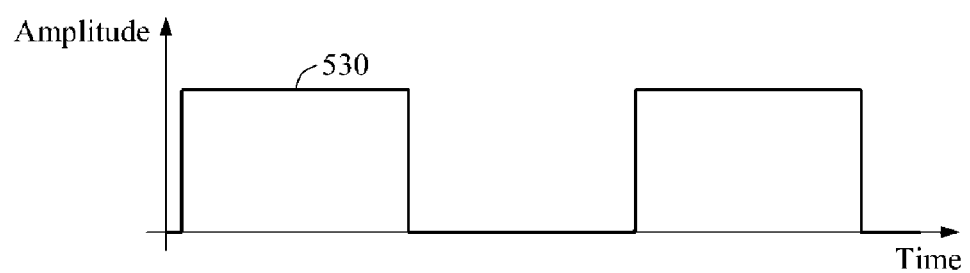

FIGS. 5A and 5B are diagrams illustrating examples of waveforms of a control signal used to control the signal processing apparatus 300 and a first electrical signal 530 generated by the first electrical signal generator 310, respectively. Logic states of a control signal n 510 and a control signal p 520 for each operation mode are indicated with reference to FIG. 5A. An amplitude of first electrical signal 530 output from the first electrical signal generator 310 is indicated with reference to FIG. 5B. Referring to FIGS. 3, 5A, and 5B, control signal n 510 is used to control the switches 365 and 370 of the second electrical signal generator 360. The control signal p 520 is used to control the first multiplexer 325, the second multiplexer 330, and the switches 385 and 390 of the second electrical signal generator 360. The logic states of the control signal n 510 and the control signal p 520 are changed successively with a delay. A control signal $\overline{P}$ having a reversed logic state to the control signal p 520 is used to control the first electrical signal generator 310. When the control signal p 520 is in a high logic state, the control signal $\overline{P}$ may be in a low logic state. Based on the control signal $\overline{P}$ in the low logic state, the first electrical signal generator 310 may be inactivated, and thus, may not generate a current signal, namely, the first electrical signal 530. When the control signal p 520 is in the low logic state, the control signal $\overline{P}$ in the high logic state may be input to the first electrical signal generator 310. Based on the control signal $\overline{P}$ in the high logic state, the first electrical signal generator 310 may be activated, and thus, may generate the current signal, namely, the first electrical signal 530. Based on a duty ratio of the control signal $\overline{P}$, an average power consumption may be determined in an entire circuit. In general, the average power consumption may be reduced according to a decrease in the duty ratio of the control signal $\overline{P}$.

Figure 6A:
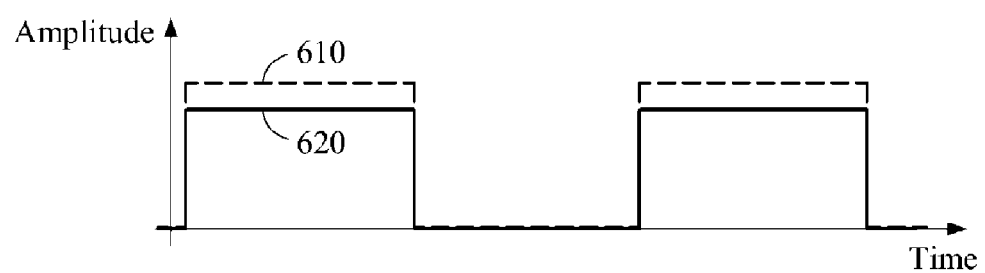
FIGS. 6A and 6B are diagrams illustrating examples of waveforms of voltage signals input to an amplifier.
Figure 6B:
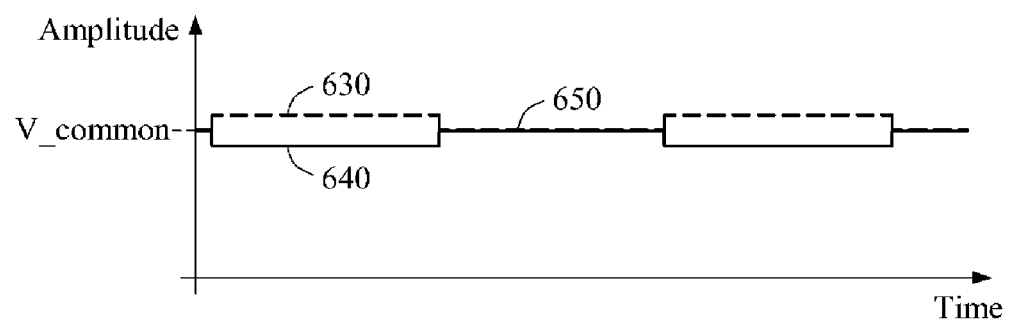

FIGS. 6A and 6B are diagrams illustrating examples of waveforms of voltage signals input to the amplifier 345. Referring to FIGS. 3 and 6A, when a second electrical signal is not supplied to the variable impedance unit 340 in a second operation mode, and when the first electrical signal generator 310 is activated or inactivated based on an operation mode, amplitudes of a voltage signal V_wp 610 and a voltage signal V_wn 620 input to the amplifier 345 are indicated as shown in FIG. 6A. The voltage signal V_wp 610 and the voltage signal V_wn 620 are output from the variable impedance unit 340 based on a first electrical signal generated by the first electrical signal generator 310 in the first operation mode. When the first electrical signal generator 310 is inactivated to halt generation of the first electrical signal in the second operation mode, a voltage signal of zero volts (V) is input to each of two input terminals of the amplifier 345. When the first electrical signal generator 310 is activated or inactivated based on the operation mode, an amplitude of the voltage signal input to the amplifier 345 may be significantly changed at a point in time at which the operation mode is changed.

Referring to FIGS. 3 and 6B, when the second electrical signal is supplied to the variable impedance unit 340 in the second operation mode, and when the first electrical signal generator 310 is activated or inactivated based on the operation mode, amplitudes of a voltage signal V_wp 630 and the voltage signal V_wn 640 input to the amplifier 345 are indicated as shown in FIG. 6B. In the first operation mode in which the first electrical signal generator 310 is activated, the voltage signal V_wp 630 and the voltage signal V_wn 640 have the same levels as compared to the voltage signal V_wp 610 and the voltage signal V_wn 620 of FIG. 6A. In the second operation mode in which the first electrical signal generator 310 is inactivated, a common-mode voltage signal V_common 650 between the voltage signal V_wp 630 and the voltage signal V_wn 640 is input to each of the input ends of the amplifier 345. In a case in which the first electrical signal generator 310 is inactivated, in the second operation mode, a voltage of the common-mode voltage signal V_common 650 is input to each of the input ends of the amplifier 345, in lieu of 0 V. When the common-mode voltage signal V_common 650 is input to the amplifier in the second operation mode, a swing width of the voltage signal input to the amplifier 345 may be decreased.

Figure 7A:
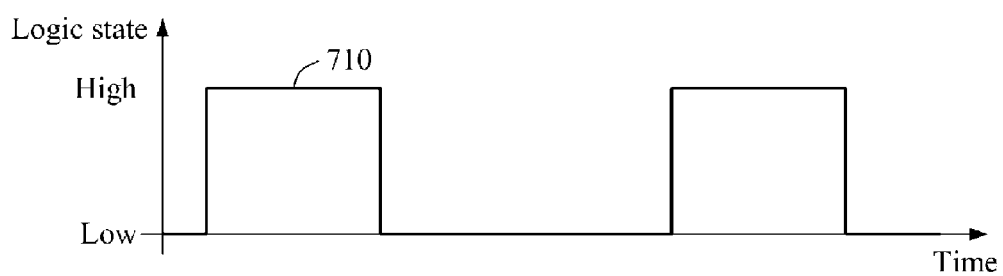
FIGS. 7A and 7B are diagrams illustrating examples of an operation of a sample and hold unit.
Figure 7B:
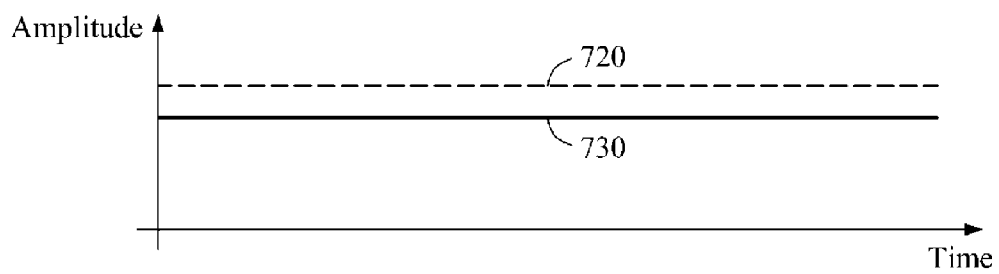

FIGS. 7A and 7B are diagrams illustrating examples of an operation of the sample and hold unit 350. A logic state of a control signal f_SH 710 used to control the sample and hold unit 350 for each operation mode is indicated with reference to FIG. 7A. Amplitudes of a signal V_SH_op 720 and a signal V_SH_on 730 output from the sample and hold unit 350 are indicated with reference to FIG. 7B. In a first operation mode, the control signal f_SH 710 has a value of a high logic state. Also, the sample and hold unit 350 samples a voltage signal output from the amplifier 345 and input to the sample and hold unit 350. In a second operation mode, the control signal f_SH 710 has a value of a low logic state. Also, the sample and hold unit 350 holds the voltage signal sampled in the first operation mode.

Figure 8:
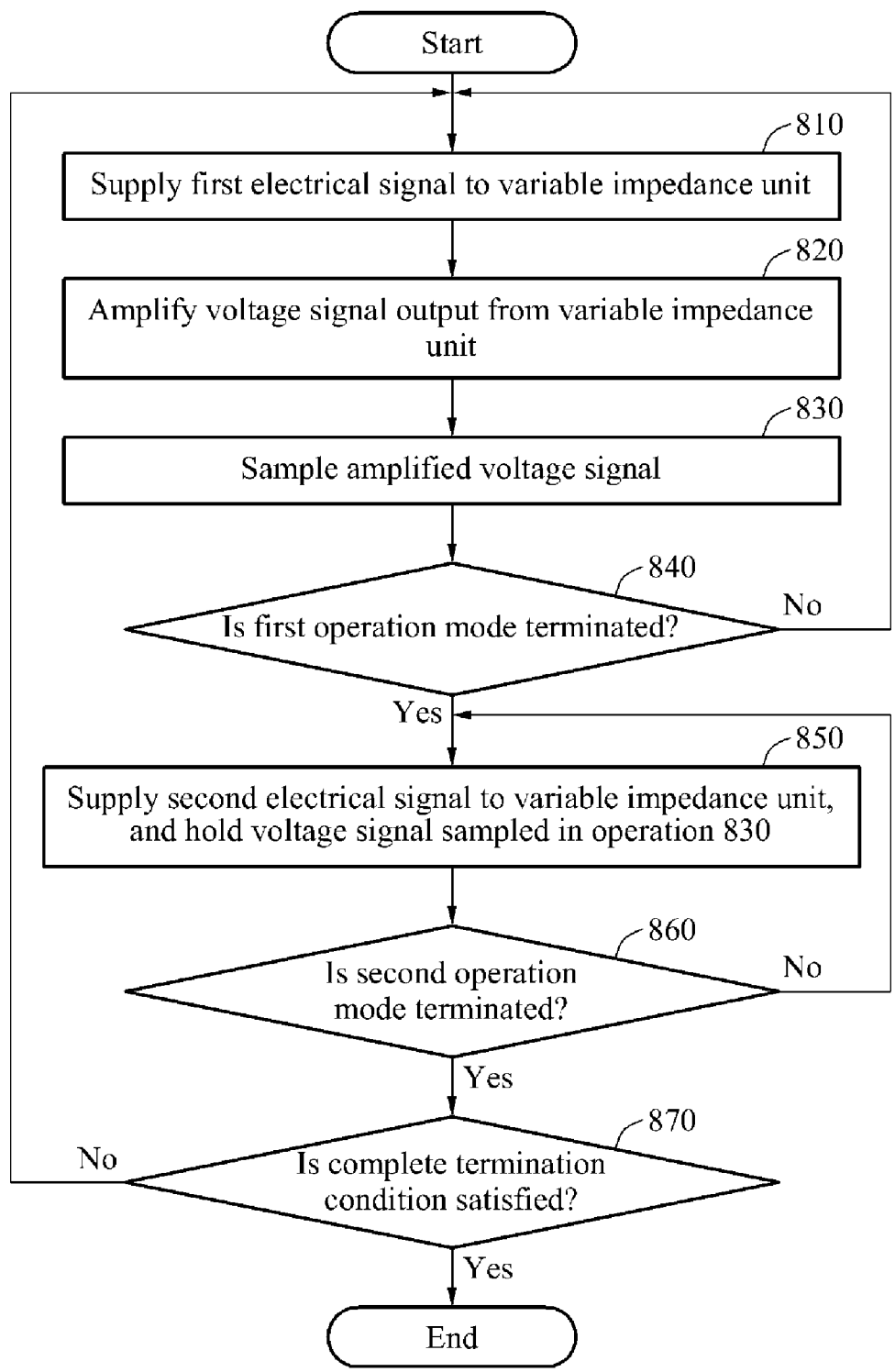
FIG. 8 is a flowchart illustrating an example of a signal processing method.

FIG. 8 is a flowchart illustrating an example of a signal processing method. In operation 810, when a first operation mode is initiated, a signal processing apparatus generates a first electrical signal, and supplies the first electrical signal to a variable impedance unit. The variable impedance unit generates a voltage signal based on the first electrical signal. In the variable impedance unit, an impedance value may be changed in response to a change in an external environment. The changed impedance value may cause a change in the voltage signal to be output. The voltage signal output from the variable impedance unit is input to an amplifier of the signal processing apparatus.

In operation 820, the signal processing apparatus amplifies the voltage signal output from the variable impedance unit, using the amplifier. Also, the signal processing apparatus may store the output voltage signal to generate a second electrical signal to be supplied to the variable impedance unit in the second operation mode.

In operation 830, the signal processing apparatus samples the amplified voltage signal. The sampled voltage signal may be stored in, for example, a capacitor element.

In operation 840, the signal processing apparatus determines whether the first operation mode is terminated. When the first operation mode is determined to be terminated, the signal processing apparatus operates in the second operation mode, and continues in operation 850. Otherwise, the signal processing apparatus returns to operation 810. In the second operation mode, the signal processing apparatus may not generate the first electrical signal.

In operation 850, the signal processing apparatus generates a second electrical signal, supplies the second electrical signal to the variable impedance unit, and holds the voltage signal sampled in operation 830. The signal processing apparatus may generate the second electrical signal based on the output voltage signal stored in the first operation mode. For example, the signal processing apparatus may generate the second electrical signal provided in a form of a common-mode voltage signal, through a combination of the output voltage signal input to the amplifier. In the second operation mode, the signal processing apparatus supplies the second electrical signal to the variable impedance unit, in lieu of the first electrical signal. In the second operation mode, the signal processing apparatus may hold or output the voltage signal sampled in the first operation mode.

In operation 860, the signal processing apparatus determines whether the second operation mode is terminated. When the second operation mode is determined to be terminated, the signal processing apparatus may reinitiate the first operation mode, and continue in operation 870. Otherwise, the signal processing apparatus returns to operation 850. A control signal is used to control the first operation mode and the second operation mode to be initiated.

In operation 870, the signal processing apparatus determines whether a complete termination condition is satisfied. When the complete termination condition is determined to be satisfied, the signal processing apparatus ends operation. Otherwise, the signal processing apparatus reinitiates the first operation mode, and returns to operation 810. That is, operations 810 through 860 are performed until satisfaction of the complete termination condition is determined in operation 870.

The various units, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A signal processing apparatus comprising:
    a first electrical signal generator configured to generate a first electrical signal;
    a second electrical signal generator configured to
        generate a second electrical signal based on a voltage signal output from a variable impedance unit, and store the voltage signal output from the variable impedance unit, in a first operation mode, and
        generate the second electrical signal based on the stored voltage signal, in a second operation mode; and
    a multiplexer configured to selectively supply the first electrical signal and the second electrical signal to the variable impedance unit.

2. The apparatus of claim 1, further comprising:
    an amplifier configured to amplify the voltage signal output from the variable impedance unit.

3. The apparatus of claim 2, further comprising:
    a modulator configured to modulate the voltage signal input to the amplifier into a signal of a high frequency band; and
    a demodulator configured to demodulate a frequency component of the amplified voltage signal.

4. The apparatus of claim 1, wherein the signal processing apparatus is configured to:
    selectively operate in the first operation mode, in which the first electrical signal generator is activated to generate the first electrical signal; and
    selectively operate in the second operation mode, in which the first electrical signal generator is inactivated to halt generation of the first electrical signal.

5. The apparatus of claim 1, wherein, in the second operation mode, the second electrical signal generator is configured to:
    generate a common-mode voltage signal based on the stored voltage signal as the second electrical signal.

6. The apparatus of claim 4, wherein the multiplexer is configured to:
    supply the first electrical signal to the variable impedance unit, in the first operation mode; and
    supply the second electrical signal to the variable impedance unit, in the second operation mode.

7. The apparatus of claim 4, further comprising:
    an amplifier configured to amplify the voltage signal output from the variable impedance unit; and
    a sample and hold unit configured to
    sample the amplified voltage signal, in the first operation mode, and hold the sampled voltage signal, in the second operation mode.

8. The apparatus of claim 7, wherein the variable impedance unit is configured to:
    output the second electrical signal to the amplifier in the second operation mode.

9. The apparatus of claim 4, wherein the operating in the first operation mode and the operating in the second operation mode alternates based on a control signal.

10. The apparatus of claim 1, wherein the variable impedance unit comprises an impedance element having an impedance value varying in response to a change in an external environment.

11. The apparatus of claim 1, wherein the variable impedance unit is a Wheatstone bridge circuit.

12. The apparatus of claim 1, wherein the signal processing apparatus is configured to operate in a wearable device.

13. A signal processing method comprising:
    supplying a first electrical signal to a variable impedance unit, generating a second electrical signal based on a voltage signal output from the variable impedance unit, and storing the voltage signal output from the variable impedance unit, in a first operation mode;
    generating the second electrical signal based on the stored voltage signal, and supplying the second electrical signal to the variable impedance unit, in a second operation mode.

14. The method of claim 13, further comprising:
    amplifying the voltage signal output from the variable impedance unit, and sampling the amplified voltage signal, in the first operation mode; and
    holding the sampled voltage signal, in the second operation mode.

15. The method of claim 13, wherein the first electrical signal is generated in only the first operation mode.

16. The method of claim 13, wherein the first operation mode and the second operation mode alternate based on a control signal.

17. A signal processing apparatus comprising:
- a multiplexer configured to supply a first electrical signal to a variable impedance unit, in a first operation mode, and to supply a second electrical signal to the variable impedance unit, in a second operation mode; and
- an electrical signal generator configured to
  - generate the second electrical signal based on a voltage signal output from the variable impedance unit, and store the voltage signal output from the variable impedance unit, in the first operation mode,
  - generate the second electrical signal based on the stored voltage signal, in the second operation mode.

* * * * *